(12) United States Patent
Kameko

(10) Patent No.: US 12,306,211 B2
(45) Date of Patent: May 20, 2025

(54) SHUNT RESISTOR, METHOD FOR MANUFACTURING SHUNT RESISTOR, AND CURRENT DETECTION DEVICE

(71) Applicant: KOA CORPORATION, Ina (JP)

(72) Inventor: Kenji Kameko, Ina (JP)

(73) Assignee: KOA CORPORATION, Ina (JP)

( * ) Notice: Subject to any disclaimer, the term of this patent is extended or adjusted under 35 U.S.C. 154(b) by 112 days.

(21) Appl. No.: 17/920,927

(22) PCT Filed: Aug. 26, 2020

(86) PCT No.: PCT/JP2020/032176
§ 371 (c)(1),
(2) Date: Oct. 24, 2022

(87) PCT Pub. No.: WO2021/220526
PCT Pub. Date: Nov. 4, 2021

(65) Prior Publication Data
US 2023/0170112 A1 Jun. 1, 2023

(30) Foreign Application Priority Data
Apr. 27, 2020 (JP) .................. 2020-078262

(51) Int. Cl.
*G01R 15/14* (2006.01)
*H01C 1/14* (2006.01)
(Continued)

(52) U.S. Cl.
CPC ............. *G01R 15/146* (2013.01); *H01C 1/14* (2013.01); *H01C 7/06* (2013.01); *H01C 17/00* (2013.01)

(58) Field of Classification Search
CPC .......... G01R 15/146; H01C 1/14; H01C 7/06; H01C 17/00; B60W 2510/242; B60W 50/0205; H01M 2220/20; H01M 2250/20
(Continued)

(56) References Cited

U.S. PATENT DOCUMENTS

2008/0030208 A1 2/2008 Aratani
2008/0171232 A1* 7/2008 Aoki .................... G11B 5/3106
428/811.2
(Continued)

FOREIGN PATENT DOCUMENTS

EP 2474008 A1 7/2012
JP H06-267707 A 9/1994
(Continued)

OTHER PUBLICATIONS

Office Action issued on May 21, 2024 in co-pending U.S. Appl. No. 17/919,944.(22 pages).
(Continued)

*Primary Examiner* — Raul J Rios Russo
*Assistant Examiner* — Trung Q Nguyen
(74) *Attorney, Agent, or Firm* — WHDA, LLP

(57) ABSTRACT

The present invention relates to a shunt resistor and a method for manufacturing the shunt resistor. The present invention relates to a current detection device including a shunt resistor. The shunt resistor (1) comprises a resistance element (5) and a pair of electrodes (6, 7) connected to both ends (5a, 5b) of the resistance element (5) in a first direction. The shunt resistor (1) has a projecting portion (11) formed on a side surface (1a), which is parallel to the first direction, of the shunt resistor (1), and a recessed portion (12) formed in a side surface (1b), which is an opposite side of the side surface (1a), of the shunt resistor (1), and extending in the same direction as the projection (11). The projecting portion
(Continued)

(11) has a portion of the resistance element (5) and portions of the pair of electrodes (6, 7), and the recessed portion (12) has a side surface (5d) of the resistance element (5) parallel to the first direction.

9 Claims, 13 Drawing Sheets

(51) Int. Cl.
  *H01C 7/06* (2006.01)
  *H01C 17/00* (2006.01)
(58) Field of Classification Search
  USPC .............. 324/126, 76.11, 500, 551, 425–434
  See application file for complete search history.

(56) References Cited

U.S. PATENT DOCUMENTS

| | | | |
|---|---|---|---|
| 2011/0057764 A1 | 3/2011 | Smith et al. | |
| 2014/0002232 A1* | 1/2014 | Smith | G01R 19/32 29/621 |
| 2015/0245490 A1* | 8/2015 | Kondou | H05K 1/11 174/260 |
| 2017/0307658 A1 | 10/2017 | Chiku et al. | |
| 2018/0005733 A1* | 1/2018 | Shinotake | G01R 1/203 |
| 2018/0122538 A1 | 5/2018 | Smith et al. | |
| 2018/0174721 A1 | 6/2018 | Kameko et al. | |
| 2019/0146007 A1* | 5/2019 | Takaishi | H01C 13/00 324/115 |
| 2019/0326038 A1 | 10/2019 | Smith et al. | |
| 2020/0011899 A1 | 1/2020 | Tsukahara et al. | |
| 2020/0200799 A1 | 6/2020 | Hung et al. | |
| 2021/0375510 A1* | 12/2021 | Kim | H01C 1/14 |
| 2022/0102032 A1* | 3/2022 | Ko | H01C 1/012 |

FOREIGN PATENT DOCUMENTS

| | | |
|---|---|---|
| JP | 3284375 B2 | 5/2002 |
| JP | 2002-519672 A | 7/2002 |
| JP | 2004-165430 A | 6/2004 |
| JP | 2007-329421 A | 12/2007 |
| JP | 2008-39571 A | 2/2008 |
| JP | 2011-47721 A | 3/2011 |
| JP | 2013-504213 A | 2/2013 |
| JP | 2014-090205 A | 5/2014 |
| JP | 2016-25328 A | 2/2016 |
| JP | 2017-005204 A | 1/2017 |
| JP | 2018-004267 A | 1/2018 |
| JP | 2019-71418 A | 5/2019 |
| JP | 2020-102626 A | 7/2020 |
| WO | 00/00833 A1 | 1/2000 |
| WO | 2016/063928 A1 | 4/2016 |
| WO | 2016/204038 A1 | 12/2016 |
| WO | 2018/150869 A1 | 8/2018 |
| WO | 2018/229817 A1 | 12/2018 |
| WO | 2018/229820 A1 | 12/2018 |
| WO | 2019/031140 A1 | 2/2019 |

OTHER PUBLICATIONS

International Search Report dated Oct. 27, 2020, issued in counterpart International Application No. PCT/JP2020/032176.
International Search Report dated Jul. 13, 2021, issued in International Application No. PCT/JP2021/016076, w/ English translation (counterpart to U.S. Appl. No. 17/919,944). (4 pages).
Related co-pending application No. U.S. Appl. No. 17/919,944.
Extended (Supplementary) European Search Report dated Jun. 11, 2024, issued in counterpart EP application No. 20933233.7. (10 pages).
Extended Supplementary European Search Report dated Mar. 4, 2025, issued in counterpart Application No. 21795394.2. (11 pages).

\* cited by examiner

SHUNT RESISTOR, METHOD FOR MANUFACTURING SHUNT RESISTOR, AND CURRENT DETECTION DEVICE

TECHNICAL FIELD

The present invention relates to a shunt resistor and a method for manufacturing the shunt resistor. The present invention relates to a current detection device including a shunt resistor.

BACKGROUND ART

A shunt resistor is widely used in current detection applications. Such a shunt resistor includes a resistance element and electrodes joined to both ends of the resistance element. In general, the resistance element is made of resistance alloy such as copper-nickel alloy, copper-manganese alloy, iron-chromium alloy, or nickel-chromium alloy. The electrodes are made of highly conductive metals such as copper. A voltage detecting portion is provided on the electrode, and the voltage generated at the both ends of the resistance element is detected by connecting a conducting wire (e.g., aluminum wire) to the voltage detecting portion.

FIGS. 21 and 22 show an example of a conventional shunt resistor. As shown in FIGS. 21 and 22, the shunt resistor 100 includes a plate-shaped resistance element 105 having a predetermined thickness and width and made of a resistive alloy, and a pair of electrodes 106 and 107 made of highly conductive metal connected to both ends of the resistance element 105. Bolt holes 108 and 109 for fixing the shunt resistor 100 with screws or the like are formed in the electrodes 106 and 107, respectively.

The shunt resistor 100 further includes voltage detecting portions 120 and 121 for measuring a voltage of the resistance element 105. In the example shown in FIG. 21, the voltage detecting portions 120 and 121 are formed integrally with the electrodes 106 and 107, respectively. The voltage detecting portions 120 and 121 extend in a width direction of the electrodes 106 and 107 from side surfaces of the electrodes 106 and 107. The voltage detecting portions 120 and 121 are arranged near the resistance element 105.

In the example shown in FIG. 22, the voltage detecting portions 120 and 121 are pins extending vertically from the surfaces of the electrodes 106 and 107, respectively. The voltage detecting portions 120 and 121 are arranged near the resistance element 105.

CITATION LIST

Patent Literature

Patent document 1: Japanese laid-open patent publication No. 2017-5204
Patent document 2: Japanese laid-open patent publication No. 2007-329421

SUMMARY OF INVENTION

Technical Problem

A temperature coefficient of resistance (TCR) characteristic is important in the shunt resistor to allow current detection under a condition that is less affected by a temperature fluctuation. The temperature coefficient of resistance is an index that indicates a rate of change in a resistance value due to temperature. Accordingly, it is an object of the present invention to provide a shunt resistor having a simple structure and capable of reducing the temperature coefficient of resistance. Furthermore, it is an object of the present invention to provide a method for manufacturing such a shunt resistor and a current detection device including such a shunt resistor.

Solution to Problem

In an embodiment, there is provided a plate shunt resistor used in current detection comprising: a resistance element; and a pair of electrodes connected to both ends of the resistance element in a first direction, the shunt resistor has: a projecting portion formed on a first side surface of the shunt resistor, the first side surface being parallel to the first direction; and a recessed portion formed on a second side surface of the first side surface of the shunt resistor, the second side surface being an opposite side of the first side surface, the recessed portion extending in the same direction as the projecting portion, the projecting portion has a portion of the resistance element and portions of the pair of electrodes, and the recessed portion has a side of the resistance element parallel to the first direction.

In an embodiment, a length of the recessed portion in the second direction perpendicular to the first direction is the same as a length of the projecting portion in the second direction.

In an embodiment, the projecting portion comprises a pair of voltage detecting portions connected to both ends of the resistance element in the first direction.

In an embodiment, the projecting portion and the recessed portion have a rectangular shape.

In an embodiment, there is provided a method for manufacturing a shunt resistor comprising a resistance element, and a pair of electrodes connected to both ends of the resistance element, the method comprising: preparing a long shunt resistor base material in which the pair of electrodes are connected to the both ends of the resistance element in a first direction; forming a projecting portion of a first shunt resistor having a portion of the resistance element of the first shunt resistor and portions of the pair of electrodes of the first shunt resistor by cutting the shunt resistor base material in the first direction in a convex shape; and forming a recessed portion of the first shunt resistor extending in the same direction as the projecting portion and a projecting portion of a second shunt resistor by cutting the shunt resistor base material in the first direction into a convex shape spaced apart from the projecting portion, the projecting portion of the second shunt resistor has a portion of the resistance element of the second shunt resistor and portions of the pair of electrodes of the second shunt resistor.

In an embodiment, there is provided a current detection device comprising: a shunt resistor of any one of claims 1 to 4; and a current detection circuit substrate having a voltage signal wiring transmitting a voltage signal from the shunt resistor, the voltage signal wiring is electrically connected to a projecting portion of the shunt resistor.

In an embodiment, the current detection circuit substrate further has a voltage terminal pad, and the voltage terminal pad is connected to the projecting portion and the voltage signal wiring.

In an embodiment, the current detection device further includes an output terminal outputting a voltage signal from the shunt resistor, and the output terminal is attached to a recessed portion of the shunt resistor.

Advantageous Effects of Invention

It is possible to reduce the temperature coefficient of resistance of the shunt resistor while maintaining a desired resistance value with a simple structure in which the projecting portion having the portion of the resistance element and the portions of the pair of electrodes is formed on the first side surface of the shunt resistor, and the recessed portion having the side surface of the resistance element parallel to the first direction is formed on the second side of the shunt resistor.

DESCRIPTION OF EMBODIMENTS

Figure 1:
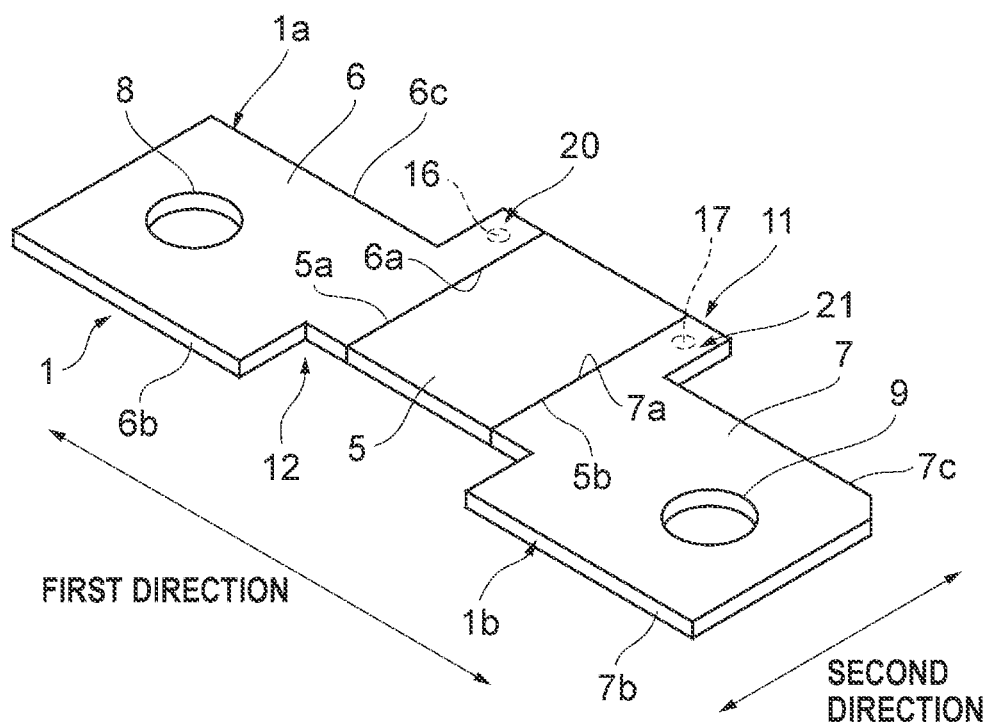
FIG. 1 is a perspective view showing one embodiment of a shunt resistor.

Embodiments of the present invention will now be described with reference to the drawings. In the drawings described hereinbelow, the same symbols are used to refer to the same or equivalent components or elements, and a duplicate description thereof is omitted. In a plurality of embodiments described below, configurations of one embodiment not specifically described are the same as the other embodiments, so its redundant description is omitted.

Figure 2:
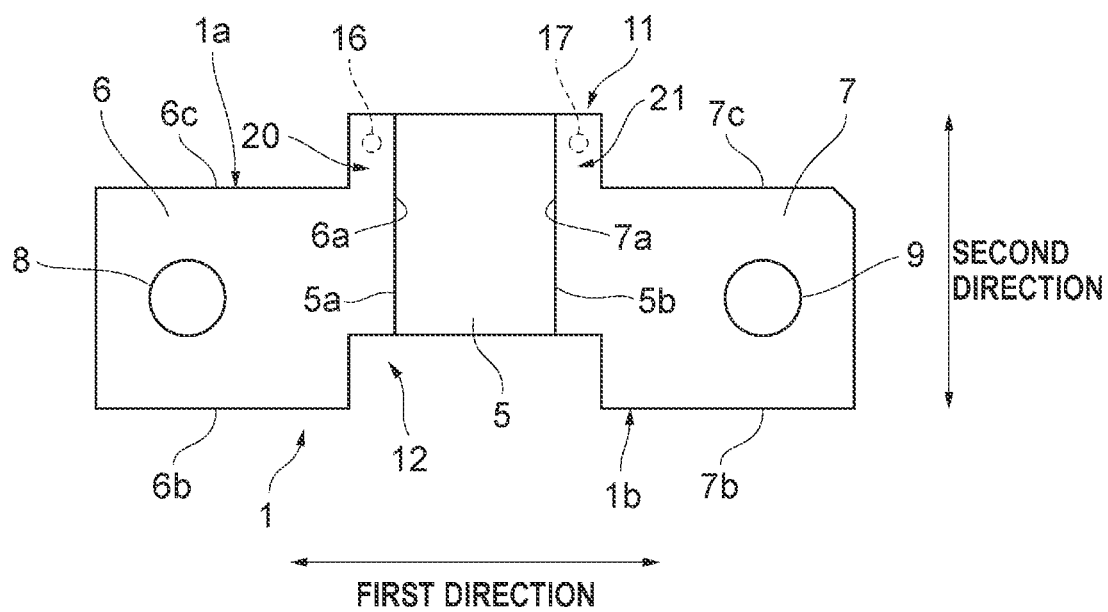
FIG. 2 is a plan view of the shunt resistor shown in FIG. 1.

FIG. 1 is a perspective view showing one embodiment of a shunt resistor 1, and FIG. 2 is a plan view of the shunt resistor 1 shown in FIG. 1. As shown in FIGS. 1 and 2, the shunt resistor 1 includes a resistance element 5 made of a resistor alloy plate material having a predetermined thickness and width, and a pair of electrodes 6 and 7 made of a highly conductive metal connected to both ends (i.e., both connecting surfaces) 5a and 5b of the resistance element 5 in a first direction. The electrode 6 has a contact surface 6a that contacts one end (one connecting surface) 5a of the resistance element 5, and the electrode 7 has a contact surface 7a that contacts the other end (other connecting surface) 5b of the resistance element 5. Bolt holes 8 and 9 for fixing the shunt resistor 1 with screws or the like are formed in the electrodes 6 and 7, respectively.

The first direction is a length direction of the resistance element 5, and corresponds to the length direction of the shunt resistor 1. The length direction of the shunt resistor 1 is a direction in which the electrode 6, the resistance element 5, and the electrode 7 are arranged in this order. A direction perpendicular to this first direction is a second direction. The second direction is a width direction of the shunt resistor 1. As shown in FIGS. 1 and 2, the electrodes 6 and 7 have the same structure, and are arranged symmetrically with respect to the resistance element 5.

The both ends 5a and 5b of the resistance element 5 are connected (bonded) to the electrodes 6 and 7 by means of welding (e.g., electron beam welding, laser beam welding, or brazing), respectively. An example of the material of the resistance element 5 is a low-resistance alloy material such as a Cu—Mn alloy. An example of the material of the electrodes 6 and 7 is copper (Cu).

The shunt resistor 1 has a projecting portion 11 formed on a side surface 1a of the shunt resistor 1, and a recessed portion 12 formed on a side surface 1b of the shunt resistor 1. The projecting portion 11 extends outward from the side surface 1a, and the recessed portion 12 extends inward (toward a center of the shunt resistor 1) from the side surface 1b. Both the projecting portion 11 and the recessed portion 12 extend in the same direction (second direction). The projecting portion 11 and the recessed portion 12 have a rectangular shape when viewed from above (when viewed from a direction perpendicular to both the first direction and the second direction).

The side surface 1a is a surface of the shunt resistor 1 parallel to the first direction, and has a side surface 6c of the electrode 6 and a side surface 7c of the electrode 7. The side surface 1b is a surface of the shunt resistor 1 parallel to the first direction, and the surface opposite to the side surface 1a. The side surface 1b has a side surface 6b of the electrode 6 and a side surface 7b of the electrode 7. The side surfaces 6b and 7b are surfaces parallel to the side surfaces 6c and 7c.

Figure 3:
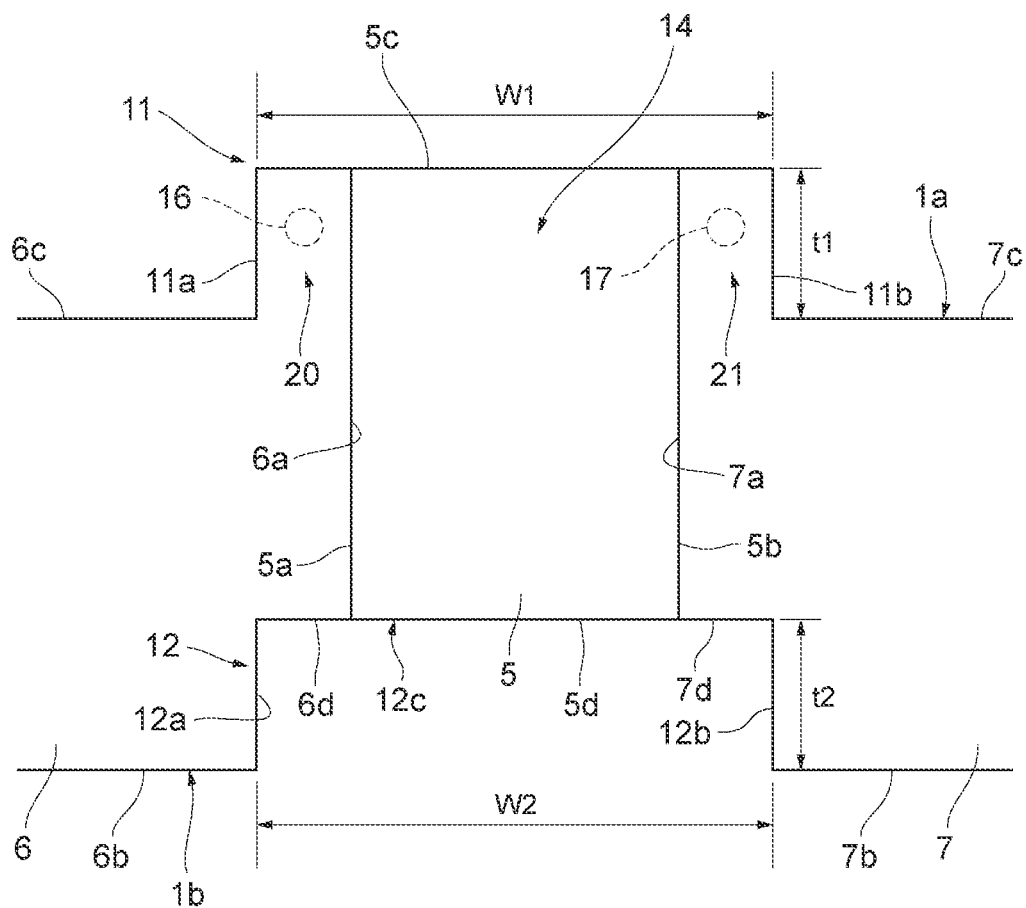
FIG. 3 is an enlarged view of a projecting portion and a recessed portion.

FIG. 3 is an enlarged view of the projecting portion 11 and the recessed portion 12. The projecting portion 11 has a portion of the resistance element 5 and portions of the electrodes 6 and 7. Specifically, the projecting portion 11 has a portion 14 which is a portion of the resistance element 5 and voltage detecting portions 20 and 21 for measuring voltages generated at the both ends 5a and 5b of the resistance element 5. The length of the portion 14 in the second direction is represented by a length t1 (the length t1 of the projecting portion 11 in the second direction) that is a distance from the side surfaces 6c and 7c of the electrodes 6 and 7 to the side surface 5c of the resistance element 5.

The voltage detecting portions 20 and 21 are portions of the electrodes 6 and 7, respectively. That is, the electrode 6 has the voltage detecting portion 20, and the electrode 7 has the voltage detecting portion 21. The voltage detecting portion 20 extends outward from the side surface 6c of the electrode 6, and the voltage detecting portion 21 extends outward from the side surface 7c of the electrode 7. The voltage detecting portions 20 and 21 are connected to the both ends 5a and 5b of the resistance element 5, respectively. The voltage detecting portions 20 and 21 are arranged symmetrically with respect to the portion 14. The length of the voltage detecting portions 20 and 21 in the second direction is also represented by the length t1.

The recessed portion 12 has a side surface 5d of the resistance element 5 parallel to the first direction. Specifically, in the present embodiment, the side surface 12c of the recessed portion 12 in the first direction (see FIG. 2) is composed of a side surface 6d of the electrode 6, a side surface 5d of the resistance element 5, and a side surface 7d of the electrode 7. In this embodiment, a width W1 (a length of the projecting portion 11 in the first direction) of the projecting portion 11 and a width W2 (a length of the recessed portion 12 in the first direction) of the recessed portion 12 are the same, and the length t1 of the projecting portion 11 in the second direction (i.e., the width direction of the shunt resistor 1) and the length t2 of the recessed portion 12 in the second direction are the same. A position of the projecting portion 11 in the first direction and a position of the recessed portion 12 in the first direction are the same. That is, a side surface 11a of the projecting portion 11 is arranged on an extension line of the side surface 12a of the recessed portion 12, and a side surface 11b of the projecting portion 11 is arranged on an extension line of the side surface 12b of the recessed portion 12.

Figure 4:
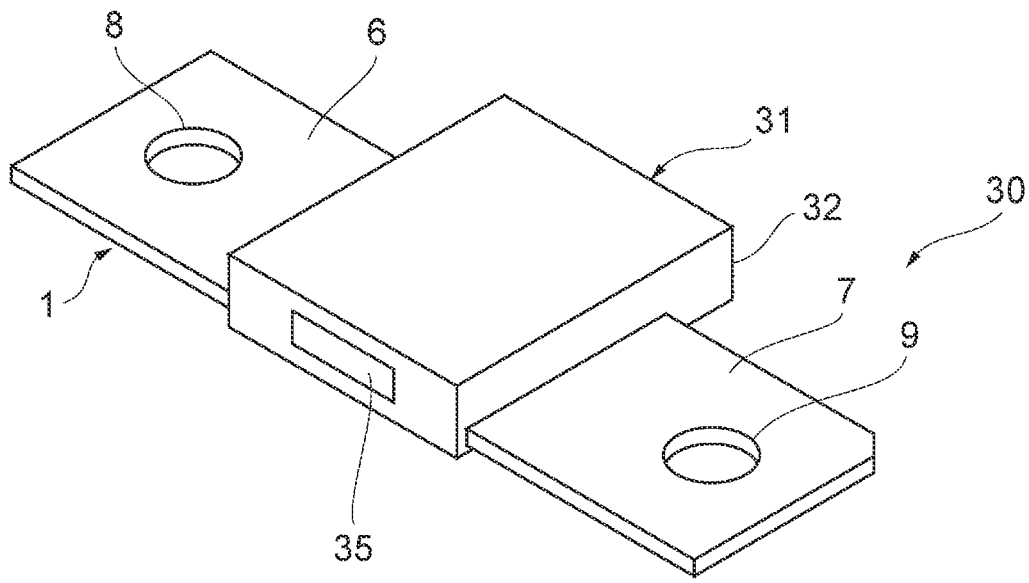
FIG. 4 is a perspective view showing an embodiment of a current detection device including the shunt resistor.

FIG. 4 is a perspective view showing an embodiment of a current detection device 30 including the shunt resistor 1. The current detection device 30 further includes a voltage output device 31 that outputs a voltage (the voltage generated at the both ends 5a and 5b of the resistance element 5) of the resistance element 5. The voltage output device 31 is connected to the shunt resistor 1. The voltage output device 31 includes a non-conductive case 32 covering the resistance element 5, and an output terminal 35 (output connector 35) for outputting a voltage signal (voltage of the resistance element 5) from the shunt resistor 1. The output connector 35 includes a first terminal, a second terminal, and a ground terminal (not shown).

Figure 5:
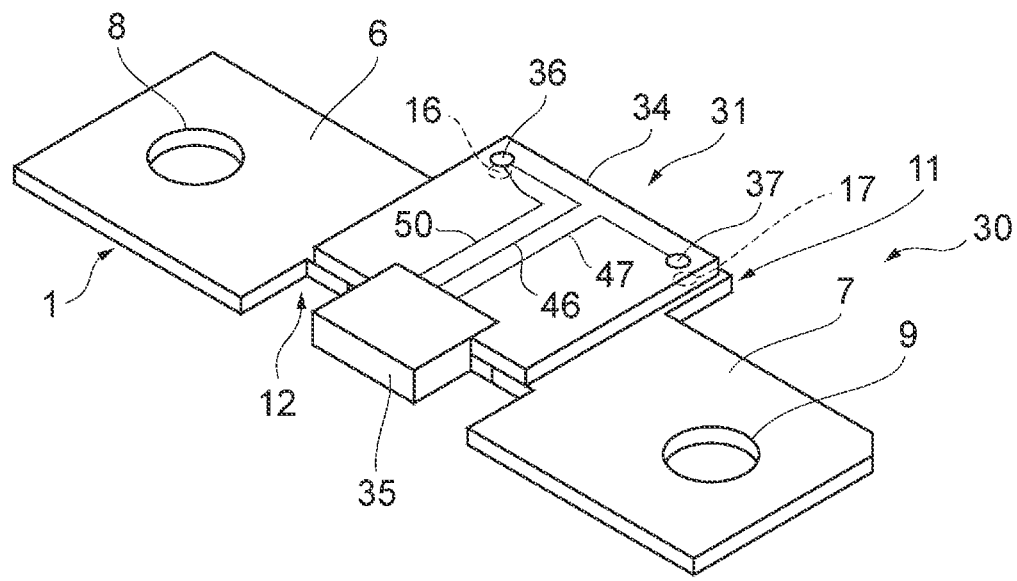
FIG. 5 is a perspective view showing the current detection device when a case of a voltage output device is removed.

FIG. 5 is a perspective view showing the current detection device 30 when the case 32 of the voltage output device 31 is removed. As shown in FIG. 5, the voltage output device 31 further includes a current detection circuit substrate 34. The current detection circuit substrate 34 has voltage signal wirings 46 and 47 for transmitting the voltage signal (voltage of the resistance element 5) from the shunt resistor 1 to the output terminal 35 and a ground wiring 50. A current detection circuit substrate 34 is arranged on the shunt resistor 1, and an output terminal 35 is attached to the recessed portion 12.

The current detection circuit substrate 34 further has voltage terminal pads 36 and 37 (copper foil portions 36 and 37). One end of the voltage signal wiring 46 is connected to the voltage terminal pad 36, and the other end is connected to the first terminal of the output connector 35. One end of the voltage signal wiring 47 is connected to the voltage terminal pad 37, and the other end is connected to the second terminal of the output connector 35. The voltage signal wirings 46 and 47 are bent and wired from the second direction (see FIG. 2) to the first direction (see FIG. 2) above the projecting portion 11. One end of the ground wiring 50 is connected to the voltage terminal pad 36, and the other end is connected to the ground terminal of the output connector 35. The voltage signal wirings 46 and 47, the ground wiring 50, and the voltage terminal pads 36 and 37 are made of a highly conductive metal (copper in this embodiment).

The voltage terminal pad 36 is connected to the voltage detecting portion 16 (see FIG. 3) of the voltage detecting portion 20 of the projecting portion 11 via an internal wiring not shown on the current detection circuit substrate 34. Similarly, the voltage terminal pad 37 is connected to a voltage detecting position 17 (see FIG. 17) of the voltage detecting portion 21 of the projecting portion 11 via the internal wiring not shown. In other words, the voltage signal wirings 46 and 47 are electrically connected to the voltage detecting positions 20 and 21 of the projecting portion 11, respectively. The above-described internal wiring and the voltage detecting portions 20 and 21 are connected by soldering or other methods. An operator connects a cable including a connector that mates with the output terminal 35 to measure the voltage generated at the both ends 5a and 5b of the resistance element 5. This configuration allows for easy measurement of the voltage of the resistance element 5. In one embodiment, an operational amplifier (amplifier), an A/D converter, and/or a temperature sensor for amplifying the voltage signal from the shunt resistor 1 may be mounted on the current detection circuit substrate 34.

Figure 6:
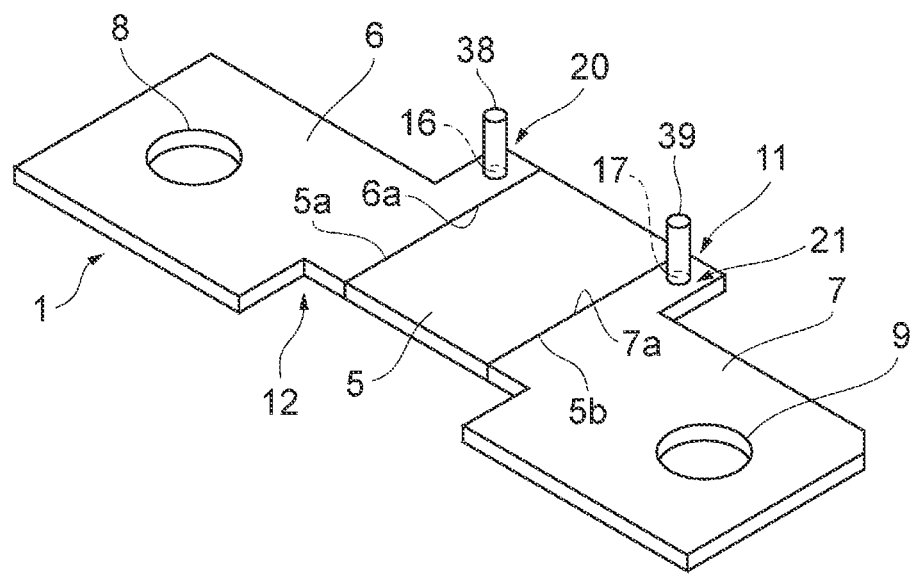
FIG. 6 is a schematic view showing a state in which a voltage detection terminal is provided in the voltage detecting portion.

In one embodiment, as shown in FIG. 6, voltage detection terminals 38 and 39 may be provided on the voltage detecting portions 20 and 21, respectively. The voltage detection terminals 38 and 39 are conductive pins extending vertically from the surfaces of the voltage detecting portions 20 and 21, respectively. Specifically, the voltage detection terminals 38 and 39 are connected to the voltage detecting positions 16 and 17 of the voltage detecting portions 20 and 21 by soldering or the like, respectively. The voltage generated at the both ends of the resistance element 5 is measured by connecting conductive wires (e.g., aluminum wires) to the voltage detection terminals 38 and 39, respectively, or inserting the voltage detection terminals 38 and 39 into through holes formed in a circuit substrate to electrically connect to the wiring formed in the circuit substrate. With such a configuration, the voltage of the resistance element 5 can be measured with a simple configuration.

Figure 7:
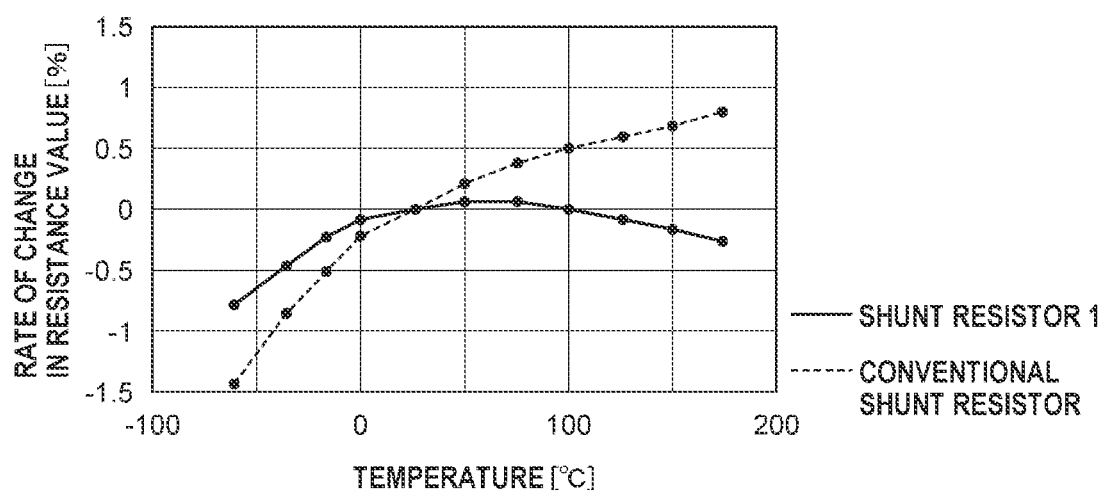
FIG. 7 is a graph showing a rate of change in a resistance value of the shunt resistor due to a temperature change.
Figure 21:
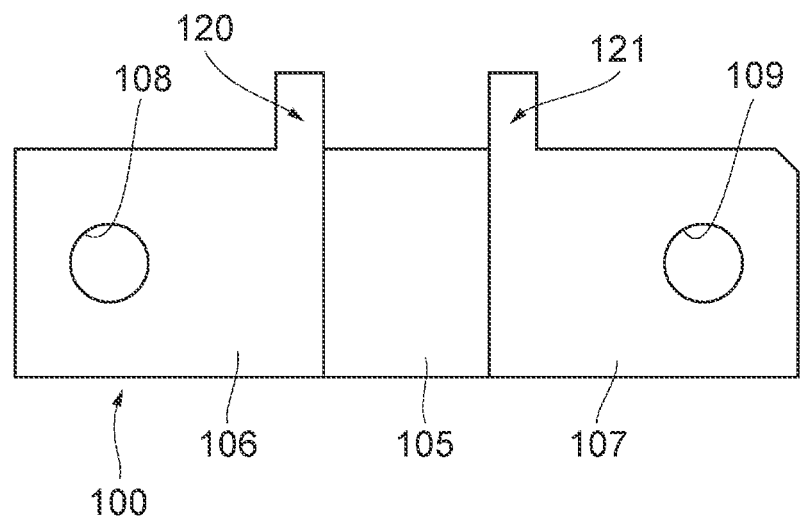
FIG. 21 is a view showing an example of a conventional shunt resistor.
Figure 22:
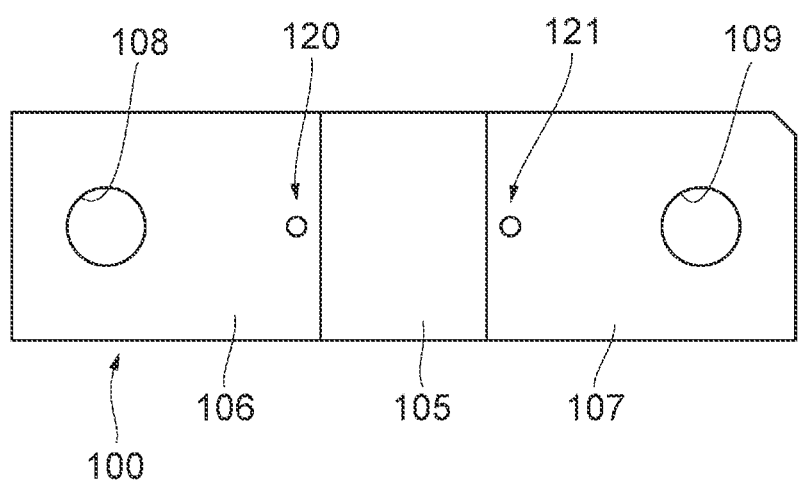
FIG. 22 is a view showing an example of a conventional shunt resistor.

FIG. 7 is a graph showing a rate of change in a resistance value of the shunt resistor 1 due to the temperature change. A horizontal axis of FIG. 7 indicates the temperature of the shunt resistor 1, and a vertical axis of FIG. 7 indicates the rate of change in the resistance value of the shunt resistor 1. A curve indicated by a solid line indicates the rate of change in the resistance value of the shunt resistor 1 of this embodiment, and a curve indicated by a dotted line indicates the rate of change in the resistance value of the conventional shunt resistor (the shunt resistor 100 shown in FIG. 21). FIG. 7 shows results when a copper-manganese alloy is used as the resistance element 5.

As is clear from a comparison of a fluctuation range of the rate of change in the resistance value of the shunt resistor 1 of the present embodiment and a fluctuation range of the rate of change in the resistance value of the conventional shunt resistor, the shunt resistor 1 of the present embodiment can reduce the fluctuation range of the rate of change in the resistance value due to the temperature change. That is, results of FIG. 7 show that the shunt resistor 1 can reduce the temperature coefficient of resistance (TCR). By forming the projecting portion 11 having the portion of the resistance element 5 and the portions of the electrodes 6 and 7 as described above, equipotential lines are distorted, and as a result, the temperature coefficient of resistance of the shunt resistor 1 can be reduced.

Figure 8:
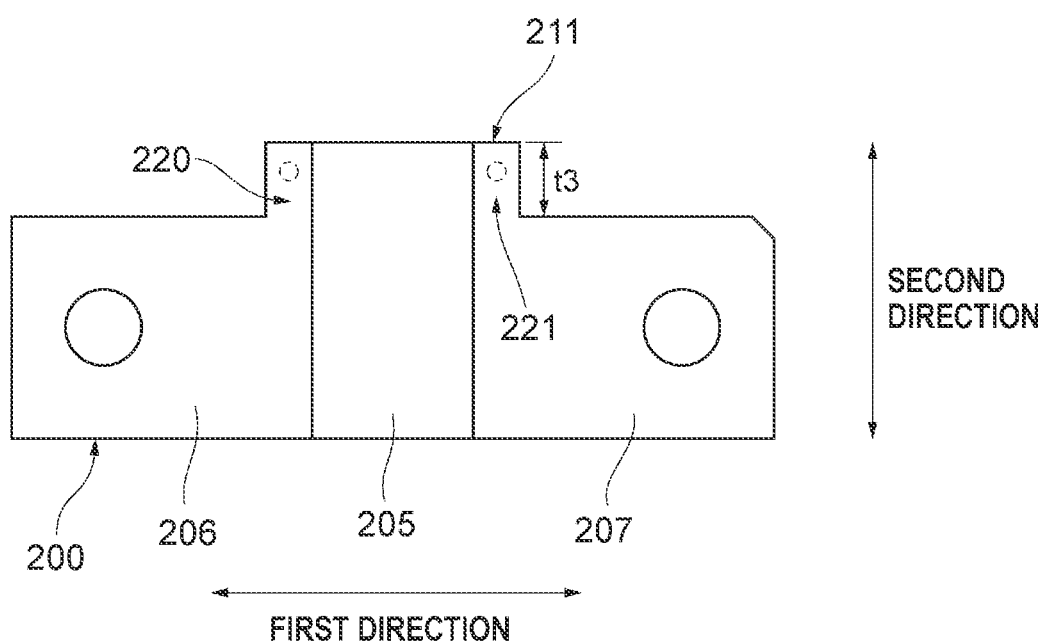
FIG. 8 is a plan view of one embodiment of a shunt resistor without the recessed portion.

FIG. 8 is a plan view of one embodiment of a shunt resistor 200 without the recessed portion 12. Configurations of the shunt resistor 200 are the same as the shunt resistor 1 except that it does not have the recessed portion 12. That is, the shunt resistor 200 includes a resistance element 205 corresponding to the resistance element 5 of the shunt resistor 1, and a pair of electrodes 206 and 207 connected to both ends of the resistance element 205. The electrodes 206 and 207 correspond to the electrodes 6 and 7 of the shunt resistor 1. The shunt resistor 200 has a projecting portion 211 corresponding to the projecting portion 11 of the shunt resistor 1, and the projecting portion 211 has a portion of the resistance element 205 and portions of the electrodes 206 and 207. The projecting portion 211 includes voltage detecting portions 220 and 221 that are portions of the electrodes 206 and 207 arranged symmetrically with respect to the resistance element 205.

Figure 9:
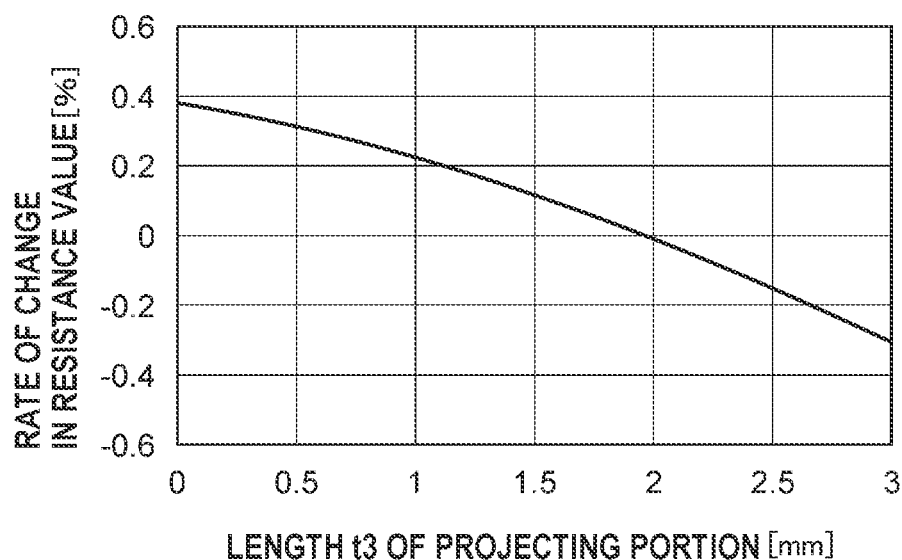
FIG. 9 is a graph showing a relationship between a length of the projecting portion in a second direction and a rate of change in the resistance value of the shunt resistor.

FIG. 9 is a graph showing a relationship between a length t3 of the projecting portion 211 in the second direction and the rate of change in the resistance value of the shunt resistor 200. FIG. 9 shows results when a copper-manganese alloy is used as the resistance element 205 for a shape of the shunt resistor shown in FIG. 8. A vertical axis of FIG. 9 indicates the rate of change in the resistance value when the temperature of the shunt resistor 200 rises from 25° C. to 100° C. The results of FIG. 9 show that the rate of change in the resistance value of the shunt resistor 200 depends on the length t3. More specifically, as the length t3 increases, the rate of change in the resistance value decreases.

Figure 10:
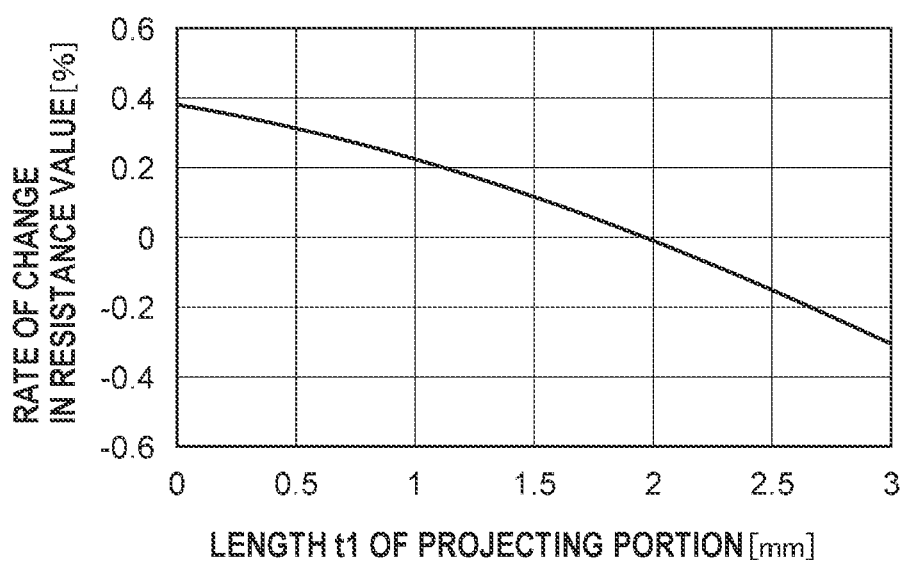
FIG. 10 is a graph showing a relationship between the length of the projecting portion of the shunt resistor and the rate of change in the resistance value of the shunt resistor.

FIG. 10 is a graph showing the relationship between the length t1 of the projecting portion 11 of the shunt resistor 1 and the rate of change in the resistance value of the shunt resistor 1. FIG. 10 shows results when a copper-manganese alloy is used as the resistance element 5 for a shape of the shunt resistor shown in FIG. 2. The length t2 of the recessed portion 12 is the same as the length t1. The vertical axis of FIG. 10 indicates the rate of change in the resistance value when the temperature of the shunt resistor 1 rises from 25° C. to 100° C. Similar to the results in FIG. 9, the results in FIG. 10 indicates that the rate of change in the resistance value of the shunt resistor 1 depends on the length t1, and the length t1 increases, the rate of change in the resistance value decreases. For example, when the length t1 is 2 mm, the rate of change in the resistance value of the shunt resistor 1 is about 0%.

As shown in FIG. 10, a rate at which the rate of change in the resistance value of the shunt resistor 1 decreases is the same as a rate at which the rate of change in the resistance value of the shunt resistor 200 shown in FIG. 9 decreases. That is, the results of FIG. 10 show that the rate of change in the resistance value depending on the temperature of the shunt resistor 1 depends on the length t1 of the projecting portion 11 rather than the recessed portion 12. Therefore, the results of FIG. 10 show that the temperature coefficient of resistance of the shunt resistor 1 can be corrected and reduced by adjusting the length t1.

Figure 11:
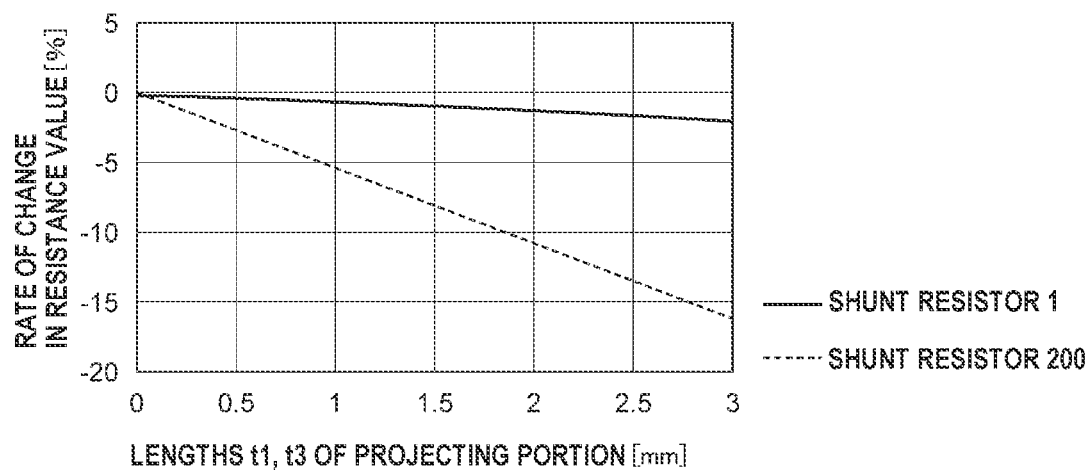
FIG. 11 is a graph showing the rate of change in the resistance value of the shunt resistor.

FIG. 11 is a graph showing the rate of change in the resistance value of each of shunt resistor 1 and the shunt resistor 200. FIG. 11 shows the rates of change of the resistance value of the shunt resistors 1 and 200 due to changes in the lengths t1 and t3 of the projecting portion 11 and 211 at a predetermined temperature (constant temperature). The length t2 of the recessed portion 12 is the same as the length t1. The results of FIG. 11 show that the resistance value of the shunt resistor 200 without the recessed portion 12 varies greatly depending on the length t3 of the projecting portion 211. For example, the resistance value of the shunt resistor 200 when the length t3 is 1.5 mm is approximately 8% lower than the resistance value when the length t3 is 0 mm. This is because the formation of the projecting portion 211 increases the length of the resistance element 205 in the second direction and changes the resistance value of the resistance element 205.

As shown in FIG. 11, in the shunt resistor 1 having the recessed portion 12, the change in the resistance value of the shunt resistor 1 due to the change in the length t1 is suppressed. This is because the length of the resistance element 5 in the second direction is kept constant by forming the recessed portion 12 having the side surfaces 5d of the resistance element 5. That is, it is possible to suppress the change in the resistance value of the shunt resistor 1 due to a formation of the projecting portion 11 by forming the recessed portion 12.

Therefore, by adjusting the length t1 of the projecting portion 11 and the length t2 of the recessed portion 12 of the shunt resistor 1 according to a size and a shape of the shunt resistor 1, the desired TCR can be satisfied while maintaining the desired resistance value. Therefore, according to this embodiment, with a simple structure in which the projecting portion 11 having the portion of the resistance element 5 and the portions of the electrodes 6 and 7 is formed on the side surface 1a of the shunt resistor 1, and in which the recessed portion 12 having the side surface 5d of the resistance element 5 is formed on the side surface 1b of the shunt resistor 1, it is possible to reduce the temperature coefficient of resistance of the shunt resistor 1 while maintaining a desired resistance value.

Figure 12:
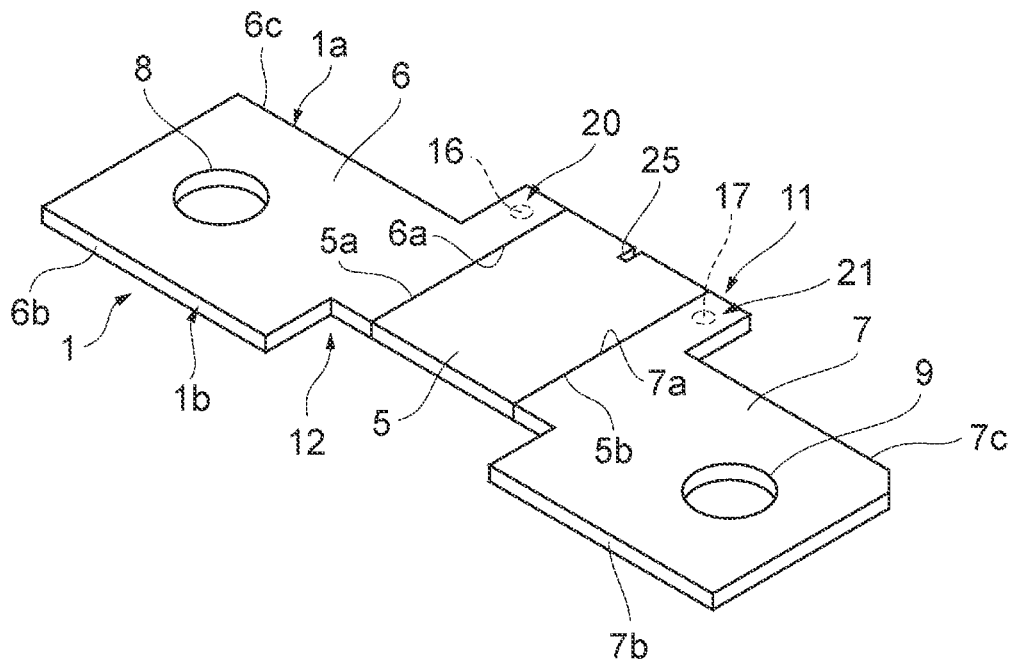
FIG. 12 is a perspective view showing another embodiment of the shunt resistor.
Figure 13:
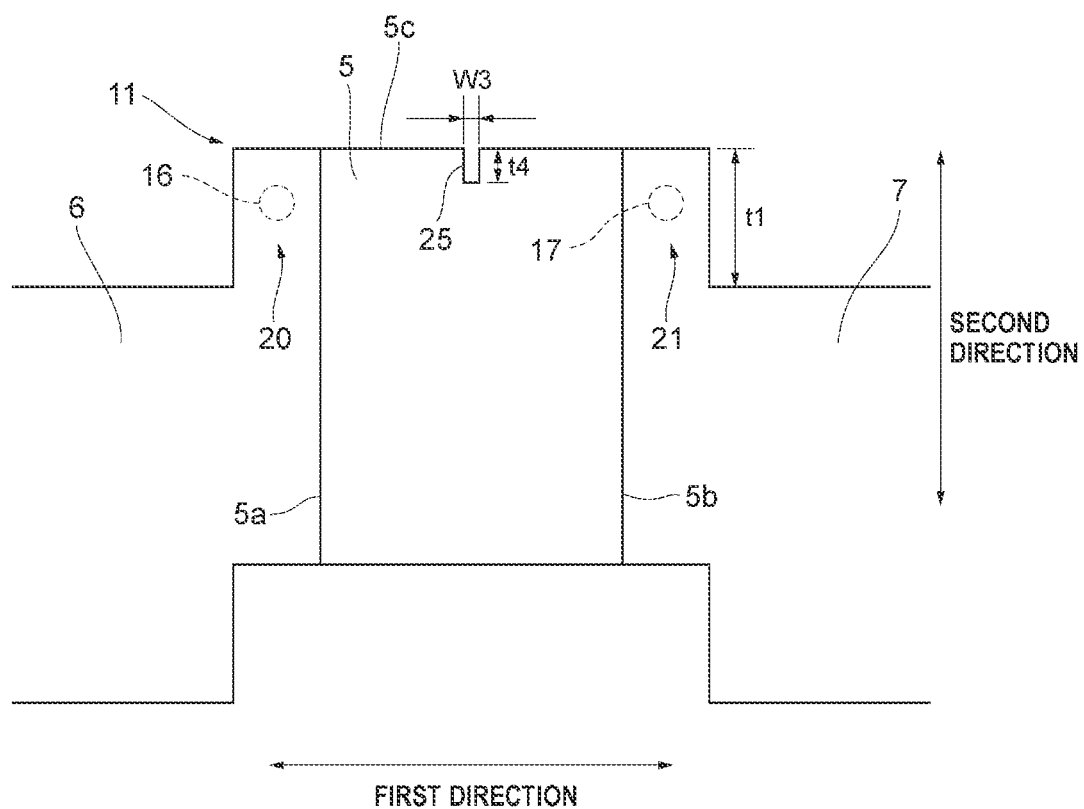
FIG. 13 is an enlarged view of the projecting portion of FIG. 12.

FIG. 12 is a perspective view showing another embodiment of the shunt resistor 1, and FIG. 13 is an enlarged view of the projecting portion 11 of FIG. 12. Configurations of this embodiment, which will not be particularly described, are the same as those of the embodiments described with reference to FIGS. 1 to 3, and redundant descriptions thereof will be omitted. The resistance element 5 of this embodiment has a cut portion 25. The cut portion 25 extends parallel to the end surfaces 5a and 5b (in the second direction shown in FIG. 2). The cut portion 25 has a slit-like shape extending linearly. The cut portion 25 is formed on the side surface 5c of the resistance element 5 and linearly extends from the side surface 5c toward an inside of the shunt resistor 1 (the central portion of the shunt resistor 1).

The resistance value of the shunt resistor can be adjusted by forming the cut portion 25 in the resistance element 5, and in addition, the TCR of the shunt resistor 1 can be finely adjusted. Specifically, the TCR can be increased by narrowing a width W3 of the cut portion 25 in the first direction and increasing a length t4 in the second direction. Also in this embodiment, the current detection device 30 described with reference to FIGS. 4 and 5 and the voltage detection terminals 38 and 39 described with reference to FIG. 6 can be applied.

Next, a method for manufacturing the shunt resistor 1 will be described. FIGS. 14(a) to 14(f) are views showing an example of manufacturing processes of the shunt resistor 1. The bolt holes 8 and 9 are omitted in FIGS. 14(a) to 14(f).

Figure 14:
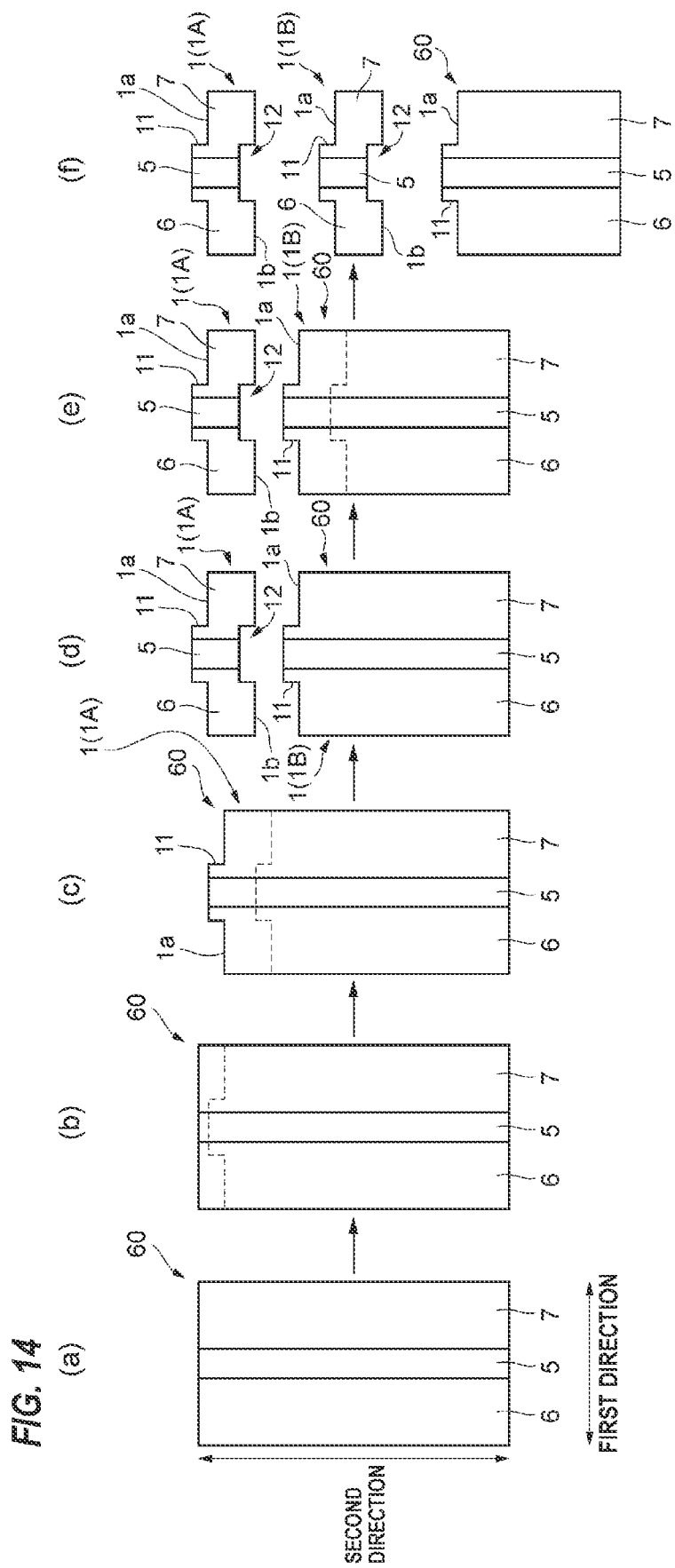
FIG. 14 is a view showing an example of manufacturing processes of the shunt resistor.

First, as shown in FIG. 14(a), a long (belt-shaped) shunt resistor base material 60 (metal plate material) in which the electrodes 6 and 7 are connected to the both ends of the resistance element 5 in the first direction is prepared. Next, as shown in FIG. 14(b), the shunt resistor base material 60 is cut in a direction in which the electrode 6, the resistance element 5, and the electrode 7 are arranged (i.e., the first direction).

Specifically, the shunt resistor base material 60 is cut in the first direction in a convex shape. The convex shape is a shape corresponding to the projecting portion 11 of the shunt resistor 1. The side surface 1a and the projecting portion 11 of the shunt resistor 1 (first shunt resistor 1A) are formed (FIG. 14(c)) by cutting the shunt resistor base material 60 in the first direction in the convex shape.

Next, as shown in FIG. 14(c), spacing in the second direction from the projecting portion 11 and the side surface 1a, and the shunt resistor base material 60 is cut in the first direction and in a convex shape, as in FIG. 14(b). As a result, the first shunt resistor 1A is separated from the shunt resistor base material 60, and the side surface 1b of a first shunt resistor 1A, the recessed portion 12 of the first shunt resistor 1A, the projecting portion 11 of the other shunt resistor 1 (second shunt resistor 1B), and the side surface 1a of the second shunt resistor 1B are formed (FIG. 14(d)).

Next, as shown in FIGS. 14(e) and 14(f), spacing in the second direction from the projecting portion 11 and the side surface 1a of the second shunt resistor 1B, and the shunt resistor base material 60 is cut in the first direction and in a convex shape, as in FIGS. 14(c) and 14(d). As a result, the second shunt resistor 1B is separated from the shunt resistor base material 60, and the side surface 1b of the second shunt resistor 1B and the recessed portion 12 of the second shunt resistor 1B are formed. A plurality of shunt resistors 1 are manufactured by repeating steps of FIGS. 14(c) to 14(f).

By manufacturing methods shown in FIGS. 14(a) to 14(f), the shunt resistor 1 can be manufactured in a simple manner, and the shunt resistor base material 60 can be used without waste. As a result, cost reduction can be achieved.

FIGS. 15 to 18 are schematic views showing still another embodiment of the shunt resistor 1. Configurations of this embodiment, which will not be particularly described, are the same as those of the embodiments described with reference to FIGS. 1 to 3, and redundant descriptions thereof will be omitted. In FIGS. 15 to 18, the bolt holes 8 and 9 are omitted. In the embodiments shown in FIGS. 15 to 18, the current detection device 30 described with reference to FIGS. 4 and 5, and the voltage detection terminals 38 and 39 described with reference to FIG. 6 can be applied.

Figure 15:
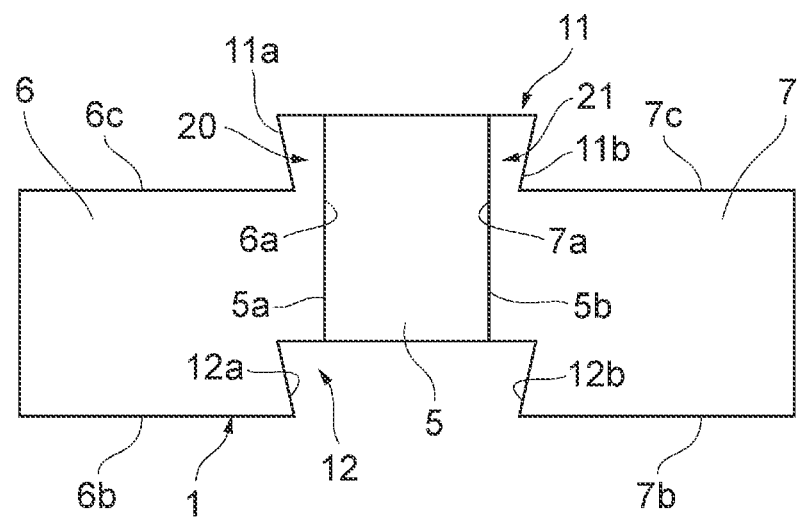
FIG. 15 is a schematic view showing still another embodiment of the shunt resistor.

In one embodiment, as shown in FIG. 15, the side surfaces 11a and 11b of the projecting portion 11 and the side surfaces 12a and 12b of the recessed portion 12 may be formed obliquely with respect to the second direction (see FIG. 2). In an example shown in FIG. 15, the side surfaces 11a and 11b extend away from the resistance element 5. The side surface 12a is formed parallel to the side surface 11a, and the side surface 12b is formed parallel to the side surface 11b.

Figure 16:
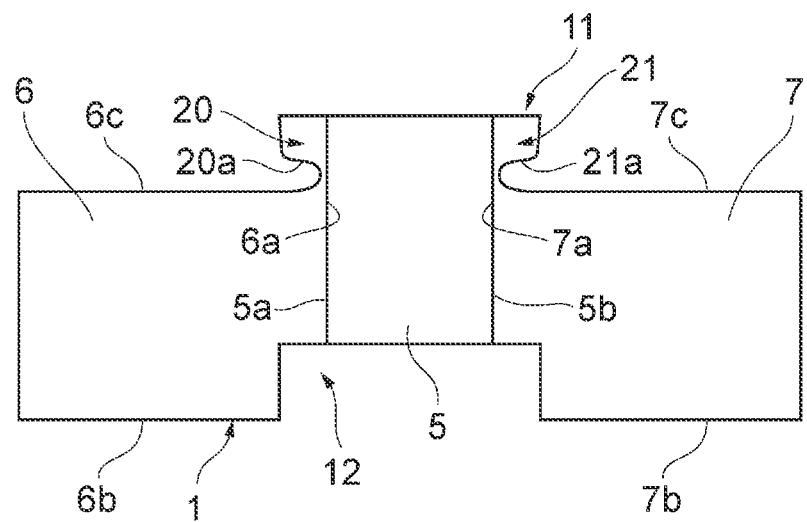
FIG. 16 is a schematic view showing still another embodiment of the shunt resistor.
Figure 17:
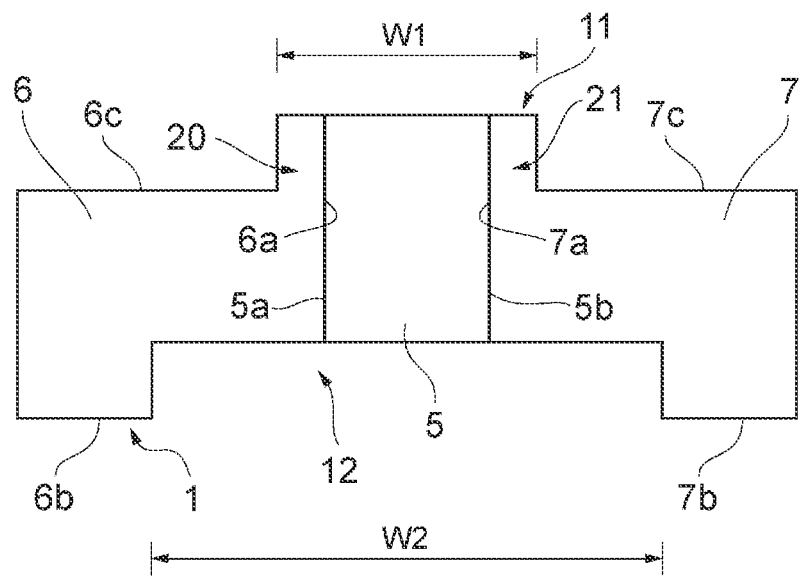
FIG. 17 is a schematic view showing still another embodiment of the shunt resistor.
Figure 18:
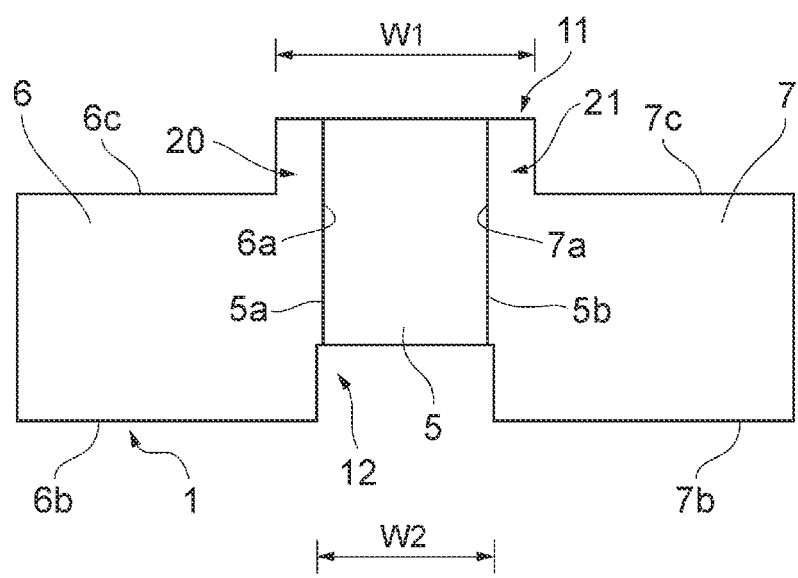
FIG. 18 is a schematic view showing still another embodiment of the shunt resistor.

In one embodiment, as shown in FIG. 16, the voltage detecting portions 20 and 21 may have cut portions 20a and 20b extending from the side surface 11a and 11b toward the resistance element 5, respectively. In one embodiment, as shown in FIG. 17, the width W2 of the recessed portion 12 may be larger than the width W1 of the projecting portion 11. As shown in FIG. 18, and the width W2 may be smaller than the width W1.

Figure 19:
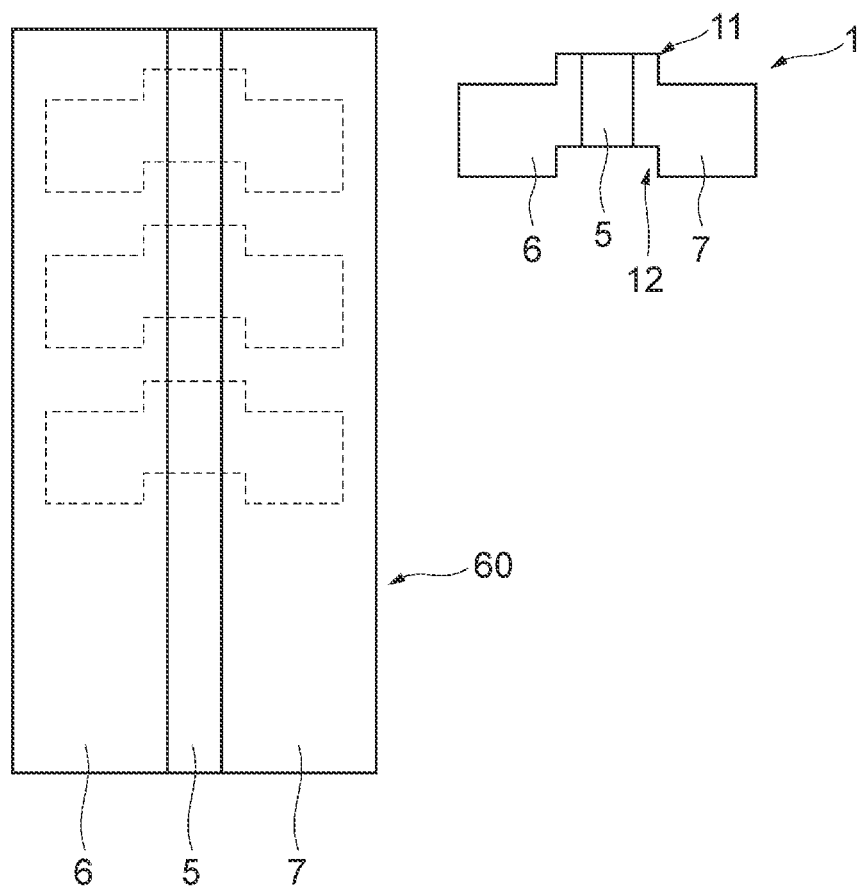
FIG. 19 is a schematic view showing another embodiment of the manufacturing method of the shunt resistor.
Figure 20:
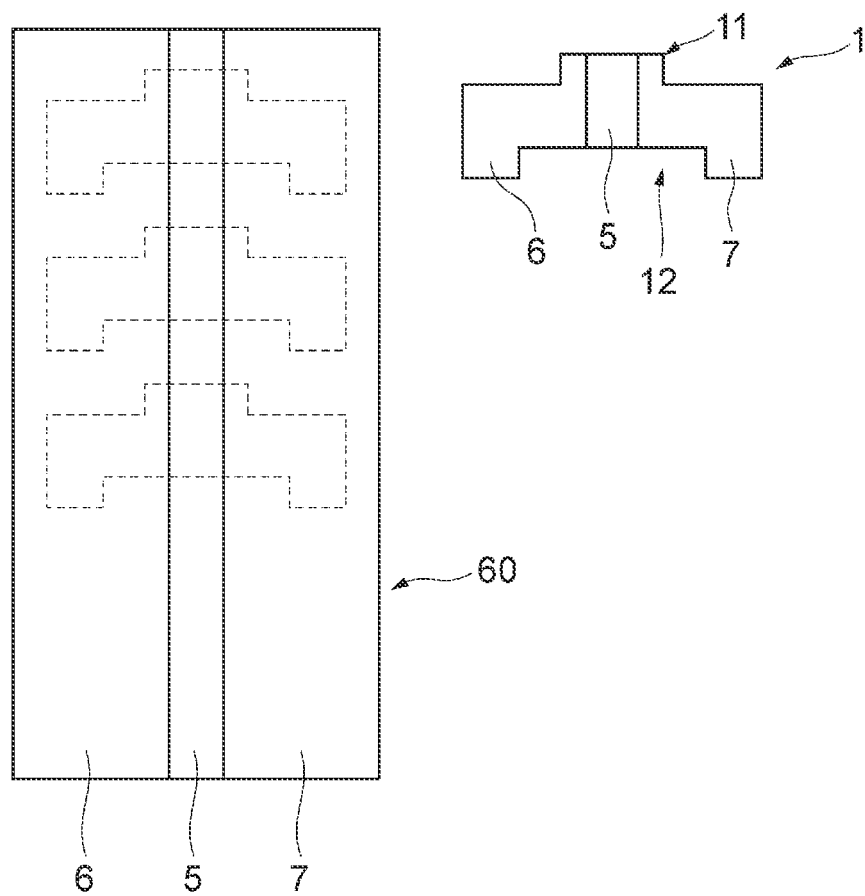
FIG. 20 is a schematic view showing another embodiment of the manufacturing method of the shunt resistor.

FIG. 19 is a schematic view showing another embodiment of the manufacturing method of the shunt resistor 1. As shown in FIG. 19, the shunt resistor 1 may be manufactured by punching the shunt resistor base material 60 into an external shape of the shunt resistor 1. As shown in FIG. 20, the shunt resistor 1 of the embodiment shown in FIG. 17 may be manufactured by the same method as described with reference to FIG. 19.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments.

Therefore, the present invention is not intended to be limited to the embodiments described herein but is to be accorded the widest scope as defined by limitation of the claims.

INDUSTRIAL APPLICABILITY

The present invention is applicable to a shunt resistor and a method for manufacturing the shunt resistor. The invention is applicable to a current detection device including the shunt resistor.

REFERENCE SIGNS LIST 1 shunt resistor
1A first shunt resistor
1B second shunt resistor
1a, 1b side surface
5 resistance element
5a, 5b both ends (both connecting surfaces)
5c, 5d side surface
6, 7 electrode
6a, 7a contact surface
6b, 6c, 6d side surface
7b, 7c, 7d side surface
8, 9 bolt hole
11 projecting portion
11a, 11b side surface
12 recessed portion
12a, 12b, 12c side surface
14 portion
16, 17 voltage detecting position
20, 21 voltage detecting portion
20a, 21a cut portion
25 cut portion
30 current detection device
31 voltage output device
32 case
34 current detection circuit substrate
35 output terminal
36, 37 voltage terminal pad
38, 39 voltage detection terminal
46, 47 voltage signal wiring
50 ground wiring
60 shunt resistor base material
100 shunt resistor
105 resistance element
106, 107 electrode
108, 109 bolt hole
120, 121 voltage detecting portion
200 shunt resistor
205 resistance element
206, 207 electrode
211 projecting portion
220, 221 voltage detecting portion

The invention claimed is:

1. A plate shunt resistor used in current detection comprising:

a resistance element; and a pair of electrodes connected to both ends of the resistance element in a first direction, wherein the shunt resistor comprises:

a first side surface disposed on a first side of the shunt resistor and extending parallel to the first direction, a second side surface disposed on a second side of the shunt resistor and extending parallel to the first direction, the second side being opposite to the first side of the shunt resistor, a projecting portion formed on the first side surface of the shunt resistor and projecting in a second direction perpendicular to the first direction, and a recessed portion formed on the second side surface of the shunt resistor and recessed in the second direction, wherein the projecting portion has a portion of the resistance element and portions of the pair of electrodes, and wherein a bottom of the recessed portion is defined by a side surface of the resistance element parallel to the first direction.

2. The shunt resistor according to claim 1, wherein a recessed depth of the recessed portion in the second direction is the same as a projecting height of the projecting portion in the second direction.

3. The shunt resistor according to claim 1, wherein the portions of the pair of electrodes of the projecting portion comprises a pair of voltage detecting portions connected to both ends of the resistance element in the first direction.

4. The shunt resistor according to claim 1, wherein a contour of the projecting portion and a contour of the recessed portion are each a rectangular shape.

5. A current detection device comprising:

a shunt resistor of claim 1; and a current detection circuit substrate having a voltage signal wiring transmitting a voltage signal from the shunt resistor, wherein the voltage signal wiring is electrically connected to the projecting portion of the shunt resistor.

6. The current detection device according to claim 5, wherein the current detection circuit substrate further has a voltage terminal pad, and wherein the voltage terminal pad is connected to the projecting portion and the voltage signal wiring.

7. The current detection device according to claim 5, wherein the current detection device further includes an output terminal outputting a voltage signal from the shunt resistor, and wherein the output terminal is attached to the recessed portion of the shunt resistor.

8. A method for manufacturing a shunt resistor comprising a resistance element, and a pair of electrodes connected to both ends of the resistance element, the method comprising:

preparing a long shunt resistor base material in which the pair of electrodes are connected to the both ends of the resistance element in a first direction;

forming a projecting portion of a first shunt resistor having a portion of the resistance element of the first shunt resistor and portions of the pair of electrodes of the first shunt resistor by cutting the shunt resistor base material in the first direction in a convex shape projecting in a second direction perpendicular to the first direction; and forming a recessed portion of the first shunt resistor recessed in the second direction while forming a projecting portion of a second shunt resistor by cutting the shunt resistor base material in the first direction at a position spaced apart from the projecting portion of first shunt resistor in the second direction into the convex shape, wherein the projecting portion of the second shunt resistor has a portion of the resistance element of the second shunt resistor and portions of the pair of electrodes of the second shunt resistor.

9. The method according to claim 8, wherein the first shunt resistor and the second shunt resistor are respectively the shunt resistor according to claim 1.

* * * * *